(12) United States Patent
Brueck et al.

(10) Patent No.: US 7,460,962 B2
(45) Date of Patent: Dec. 2, 2008

(54) METHOD FOR AN AUTOMATIC OPTICAL MEASURING OF AN OPC STRUCTURE

(75) Inventors: Hans-Juergen Brueck, Munich (DE); Gerd Scheuring, Munich (DE)

(73) Assignee: Muetec Automatisierte Mikroskopie und Messtecknik GmbH, Munich (DE)

( * ) Notice: Subject to any disclaimer, the term of this patent is extended or adjusted under 35 U.S.C. 154(b) by 1021 days.

(21) Appl. No.: 10/490,327

(22) Filed: Mar. 19, 2004

(65) Prior Publication Data

US 2008/0071479 A1    Mar. 20, 2008

Related U.S. Application Data

(63) Continuation of application No. PCT/EP02/10545, filed on Sep. 19, 2002.

(30) Foreign Application Priority Data

Sep. 20, 2001   (DE) ................ 101 46 355

(51) Int. Cl.
  *G01B 3/00* (2006.01)
  *G01B 5/00* (2006.01)
  *G01B 5/02* (2006.01)
  *G01B 5/14* (2006.01)
  *G01B 7/02* (2006.01)
  *G01B 7/14* (2006.01)
  *G01N 21/00* (2006.01)

(52) U.S. Cl. ............... 702/33; 702/158; 356/237.2

(58) Field of Classification Search ........... 702/33; 356/237.2

See application file for complete search history.

(56) References Cited

U.S. PATENT DOCUMENTS 3,879,131 A * 4/1975 Cuthbert et al. ............ 356/521

(Continued)

FOREIGN PATENT DOCUMENTS

DE         101 33 846 A1      5/2002

(Continued)

OTHER PUBLICATIONS

Chao, K-J., et al. "Metrology Issues of Reticles with Optical Proximity Correction Assist Features Using the Atomic Force Microscope", Metrology, Inspection and Process Control for Microlithography XIV, Proceedings of the SPIE vol. 3998 2000.

(Continued)

*Primary Examiner*—Michael P Nghiem
(74) *Attorney, Agent, or Firm*—Michael A. Glenn; Glenn Patent Group

(57) ABSTRACT

The invention relates to a method for optical measurement of an OPC structure (306), having a pre-determined structure (302) on a photo-mask, in order to determine a measurement of the structure in at least one direction, whereby, firstly, a region (300) is determined on the photo-mask, which comprises the OPC structure (306) to be measured. The intensity of the determined region (300) is then scanned in a first direction and the region in which the intensity passes a threshold is determined for each scan. The maximum separation between an edge (308) of the structure (302) and an edge (312) of the corresponding OPC structure (306) is determined, based on the difference of the determined regions.

6 Claims, 4 Drawing Sheets

U.S. PATENT DOCUMENTS

| | | | | |
|---|---|---|---|---|
| 4,633,504 | A | * 12/1986 | Wihl | 382/145 |
| 6,836,560 | B2 | * 12/2004 | Emery | 382/145 |
| 7,027,143 | B1 | * 4/2006 | Stokowski et al. | 356/237.2 |
| 7,123,356 | B1 | * 10/2006 | Stokowski et al. | 356/237.2 |

FOREIGN PATENT DOCUMENTS

| | | | |
|---|---|---|---|
| JP | 1118727 | A | 4/1999 |
| WO | 03/025979 | * | 3/2003 |

OTHER PUBLICATIONS

Doe, N. et al. "Optical Proximity Effects in Sub-micron Photomask CD Metrology", 16th European Conference on Mask Technology for Integrated Circuits and Microcomponents Proceedings of the SPIE vol. 3996 2002.

Matsuo, F., et al. "Pattern Shape Analysis tool for Defect Judgement of Photomask", Photomask and Next generation Mask Technology VII; Proceedings of the SPIE, vol. 4066, 2000.

Fiekowsky, P., et al. "Mask Defect Disposition: Flux Area Measurement of Edge, Contact, and OPC Defects Correlates to Wafer and Enable Effective Decisions", Paper 4409-10, Presented at Photomask Japan 2001, Apr. 2001.

Fiekowsky, et al.; *Mask Defect Dispositon: Flux-Area Measurement of Edge, Contact, and OPC Defects Correlates to Wafer and Enables Effective Decisions*; Apr. 2001; Presented at Photomask Japan 2001, Paper 4409-10.

Matsuo, et al.; *Pattern Shape Analysis tool for Defect Judgement of Photomask*; 2000; Photomask and Next-Generation Lithography Mask Technology VII, Proceedings of SPIE vol. 4066.

* cited by examiner

METHOD FOR AN AUTOMATIC OPTICAL MEASURING OF AN OPC STRUCTURE

CROSS-REFERENCE TO RELATED APPLICATIONS

This application is a continuation of co-pending International Application No. PCT/EP02/10545, filed Sep. 19, 2002, which designated the United States and was not published in English.

BACKGROUND OF THE INVENTION

1. Field of the Invention

The present invention relates to a method for an optical measuring of an OPC structure, in particular for measuring an OPC structure associated with a predetermined structure on a photo mask.

2. Description of the Related Art

The trend in semiconductor manufacturing goes more and more toward smaller and smallest structures. The common method here is the illumination of wavers using photomasks by means of light (e.g. using visual wavelengths or wavelengths in the UV range), ion beams, electron beams, x-rays, or other methods to be mapped (lithography). At that, the structures to be mapped, like e.g. thin conductive traces or small contacts, are often in the range of or even smaller than the used wavelengths, which inevitably leads to mapping errors. The limits for mapping for lithography methods which use visible light range from a structure size of about 350 nm to 400 nm, and the mapping limit for lithography methods which use UV light range from about 250 nm to 300 nm. In particular, due to the limited resolution, corners of structures or line ends are mapped strongly rounded off onto the waver.

In order to achieve a better pattern fidelity compared to the original design or layout, the above-mentioned critical locations (corners, line ends) on the photomask are provided with OPC structures or OPC-similar structures (OPC=Optical Proximity Correction).

In connection with the present description, the term OPC structure refers to any structure or any element which is added to a photomask in order to guarantee or support, respectively, the true mapping of the mask onto a substrate.

The OPC structures serve to change the structures actually to be generated on the photomask in a deliberate way in order to achieve a better mapping on the waver, i.e. for example less rounded at the corners.

With reference to FIG. 1, in the following two examples for the layout of OPC structures for the generation of photomasks are described. In FIG. 1A a section 100 of a layout is shown including a portion of a first structure 102. In order to prevent a roundoff in the area of the corner 104 due to the mapping of the layout 100 onto the photomask, an OPC structure 106 is provided there protruding beyond the horizontal edge 108 and the vertical edge 110 of the structure 102 in the area of the corner 104. In the example shown in FIG. 1A for a layout, the OPC structure 106 is substantially square. The OPC structure at the corner 104 shown in FIG. 1A is also referred to as corner serif.

In FIG. 1B a section 200 of a layout is shown together with a portion of a second structure 202. The second structure 202 is a line, and in the section 200 of the layout the line end of the structure 202 is illustrated. The structure 202 includes two parallel vertical edges 204 and 206 and a horizontal edge 208 connected to the vertical edges 204 and 206 in the area of a first corner 210 and in the area of a second corner. When transmitting the layout 200 onto a photomask, a similar problem results as in the transmission of the layouts described with reference to FIG. 1A, i.e. that the structure generated on the photomask in the area of the corners 210 and 212 is rounded off, so that also here, similar to FIG. 1A, an OPC structure needs to be provided in the area of the corners 210 and 212. In FIG. 1B two OPC structures 214 and 216 are arranged in the area of the corners 210 and 212, respectively, wherein the OPC structures respectively protrude beyond corners 204 and 208 and 206 and 208, respectively. As in FIG. 1A, also here the OPC structures are basically of a square nature. The structure shown in FIG. 1B is also referred to as line end serifs. A special case of theses OPC structures in which the serifs are adjacent to each other at the line end is also referred to as a hammerhead.

Conditional on the function, the OPC structures 106, 214, and 216 illustrated in FIGS. 1A and 1B are very small (approx. 200 nm and smaller).

Instead of the structures described in FIG. 1 also other structures and elements are possible, e.g. so-called jogs or scatterbars, in order to improve the edge quality.

In the conventional quality testing and quality assurance of photomasks for example generated using the layouts as they were described with reference to FIGS. 1A and 1B using optical microscopy, these small dimensions of the OPC structures represent a special challenge. Further, due to the high number of OPC structures in different spatial orientations on only one photomask a demand exists for an automatic method for the recognition and measuring of these structures.

SUMMARY OF THE INVENTION

Based on this prior art it is the object of the present invention to provide a method enabling the optical measuring of an OPC structure associated with a predetermined structure on a photomask with a minimum effort.

The present invention provides a method for an optical measuring of an OPC structure (306; 406) associated with a predetermined structure (302; 402) on a photo mask with the following steps:

(a) specifying an area (300; 400) on the photomask including the OPC structure (306; 406) to be measured and a first edge (310; 404, 406) of the predetermined structure (302; 402).

(b) sampling of the intensity image of the specified area (300; 400) row-wise in a first direction perpendicular to the first edge (310; 404, 406) of the predetermined structure (302; 402), and for each row:

(b.1) determining the location in which the intensity passes a threshold, and (c) based on the locations specified in step (b.1), determining a location lying farthest out with reference to the predetermined structure (302; 402), and a location lying farthest in with relation to the predetermined structure (302; 402); and (d) determining the maximum distance between the first edge (310; 402, 404) of the predetermined structure (302; 402) and a first edge (312; 414, 416) of the associated OPC structure (306; 406) based on the difference of the location lying farthest out and the location lying farthest in.

According to a first embodiment, the structure is measured in two directions. In this case, first of all a sampling of the intensity of the specified area in a second direction is performed, and for each sampling in the second direction a location is determined in which the intensity passes a threshold and the maximum distance between an edge of the structure and an edge of the associated OPC structure is determined based on the difference of the specified locations. Alternatively, instead of the additional sampling in the second direction, the photomask may be rotated and the sampling is repeated in the first direction.

According to a further embodiment of the present invention, the threshold is determined based on the intensities associated with the structure and a background of the structure.

According to a further preferred embodiment, after specifying an area on the photomask first of all the type of the structure and/or the orientation of the structure with regard to a reference position is identified. The type of the structure is preferably identified by sampling the determined area along the edges of the area. For identifying the corner serif, the sampling of the corners of the area is sufficient. In other cases, the intensity course or the number of intensity transitions between light and dark along all edges is used, respectively, to determine the type of the structure.

The present invention enables an automatic method, which firstly enables the recognition of a "corner serif", "line end serifs", or other OPC or OPC-similar structures on a photomask with a minimum effort on the operator side and to measure the same with a sufficient accuracy.

The inventive method reduces errors that may be caused by the operator, as it operates objectively and thus eliminates errors caused by subjective assessments.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 2A:
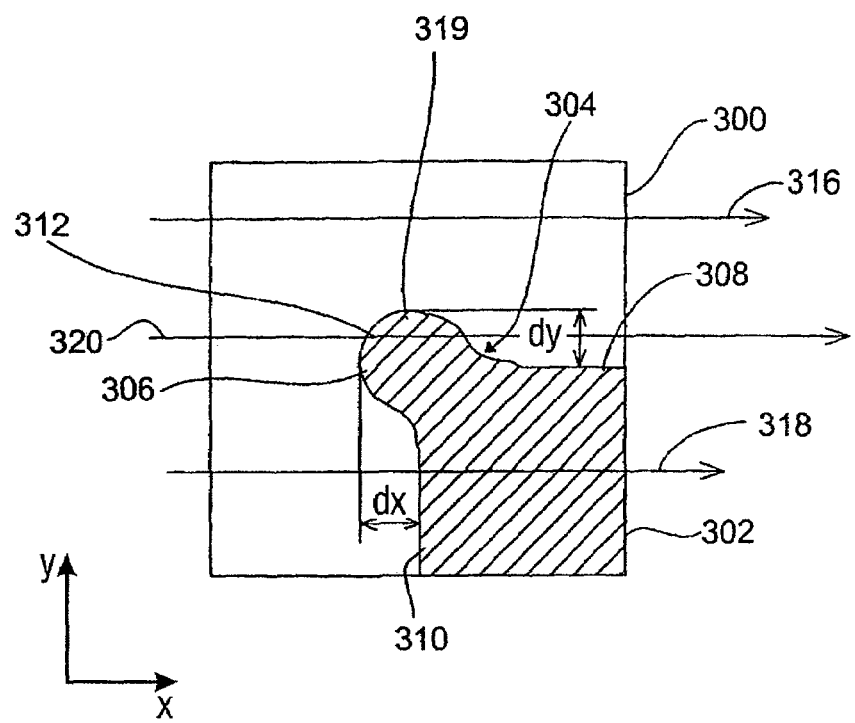
FIG. 2A shows a section of a photomask generated using the layout section of FIG. 1A.

In FIG. 2A an illustration of an intensity image (section 300) of a photomask is shown generated using conventional imaging methods, e.g. by a microscope with an associated CCD camera. Alternatively, it may also be an SEM image or another image, which was generated by other imaging methods.

Figure 1A:
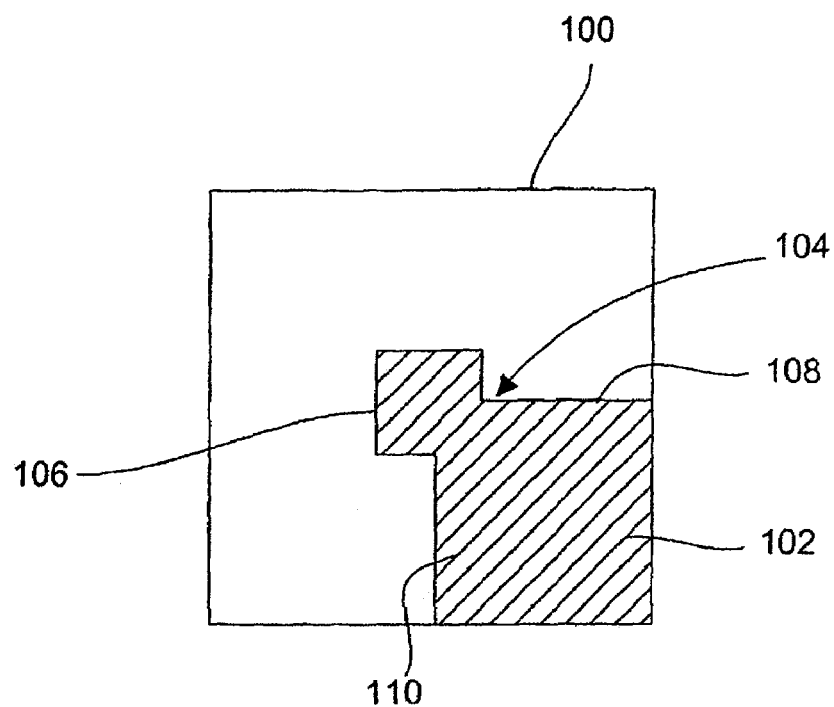
FIG. 1A shows a schematical illustration of a layout for a portion of a photomask, wherein the layout shows a corner with corner serif.

In FIG. 2A a section 300 of a photomask is shown, wherein the section 300 was generated by transmitting the layouts of FIG. 1A onto a photomask. The section 300 includes a portion of a photomask structure 302 including a corner 304. In the area of the corner 304 of the structure 302 on the photomask the OPC structure 306 was generated which, compared to the structure in the layout (see FIG. 1A), was generated with rounded-off edges on the photomask. As it may be seen, the OPC structure 306 is implemented such that the same protrudes beyond a horizontal edge (in the x direction) of the structure 302 and beyond a vertical edge 310 (in y direction) of the structure 302.

In order to test the generated photomask with regard to its quality, it is required now to test the generated OPC structure 306 with regard to its dimensions, in particular with regard to the distance of the same from the edges 308 and 310, in order to guarantee that the thus generated OPC structure 306 causes the desired correction in the corner area of the structure generated on the substrate in an application of the photomask for generating a structure on a substrate. According to the present invention, a method is provided which firstly enables to measure the distances dx and dy of the OPC structure 306 on the photomask from the structure 302 with a sufficient accuracy with a minimum effort from the operator side.

Using an optical microscope, which is provided with a CCD camera, an intensity image of the photomask is generated containing the structure to be examined, i.e. the structure 302 with an associated OPC structure 306. Around the structure to be examined an image section is defined, section 300, which is the so-called ROI (ROI=Region of Interest). The selection of this area may either be performed manually by a user or, depending on whether the layout information is known, in an automatically controlled way. The size of the ROI 300 is not critical here, the only important thing is that the ROI 300 does not contain any other structures but only the structure 302 with the associated OPC structure 306, which is to be measured. As soon as the area 300 is determined, the measuring is performed automatically by the inventive method.

Due to the limited spatial resolution of the microscope, the ROI 300 contains a somewhat blurred mapping of the overall structure 302, 306 to be examined. Otherwise, the structure 302, 306 is mapped with an approximately constant brightness, and via the evaluation of the intensity distribution within the ROI 300 using a suitable method (e.g. histogram), a brightness of the structure 302, 306 and a brightness of the background is established. Here, it is not important whether it is a bright structure in front of a dark background or a dark structure in front of a light background, as it is illustrated in FIG. 2A.

After the ROI 300 has been determined, all edges of the overall structure 302, 306 are probed in horizontal direction (x direction) and vertical direction (y direction).

To this end, e.g. first in the x direction, the intensity in the area 300 is sampled, wherein for each sampling in the x direction the location is specified in which the determined intensity passes a threshold, i.e. for example an intensity signal of a value representing a light background changes to a value representing a dark background (See FIG. 2A), whereby the presence of an edge within the photomask may be determined. The edge sampling is performed, as mentioned above, using the threshold value method, which uses a constant threshold which is preferably calculated from the mean intensities of the structure to be measured and the background. At that, the threshold value is selected so that the measuring error resulting from the limited resolution of the microscope and the blurring of the small OPC structure resulting from it is minimized.

The sampling in the x direction is performed such that in each row a plurality of sampling points are selected for which the intensity is determined. The location in which an intensity change from light to dark takes place is determined for each row and based on the difference of the locations of the edge 310 of the overall structure 302, 306 for each row, the maximum distance between an edge 312 of the OPC structure 306 and the edge 310 of the structure 302 to dx is determined.

Analogue to this, a maximum distance between a horizontal edge 314 of the OPC structure 306 and the edge 308 of the structure 302 to dy is determined.

In the area of the edge of the structure, the edge sampling with the smallest possible spatial resolution along the edge to be measured is performed. In case of a bad signal-to-noise ratio also a coarser spatial resolution may be selected, wherein then two or more rows or columns, respectively, perpendicular to the edge are combined.

Due to the thus performed determination of the locations of the edges it is now possible to obtain all relevant dimensions of the OPC structure 306 overlaid over the structure 302 from the thus obtained edge profiles in horizontal direction and in vertical direction, i.e. the dimensions dx and dy for the corner serif, as it is shown in FIG. 2A. The final result consists of the dimensions of the OPC structure 306 both in horizontal direction and vertical direction, or the distance, respectively, by which the OPC structure is taller than the structure to be measured, wherein for the example shown in FIG. 2A a measurement value pair dx, dy is generated. Optionally, also the edge positions with regard to a predetermined reference position, the overall edge course resulting from individual samplings and the type of the found structure (type, orientation, light/dark) are output.

In an alternative approach, instead of the sampling of individual points in the rows, one row or one column, respectively, is completely sampled in order to generate the sum of the intensity values of this sampling. The thus generated overall intensity values for each row or column, respectively, are compared to a first and a second threshold. For the embodiment illustrated in FIG. 2A, an overall intensity value below the first threshold indicates, that the row comprises no component of the structure 302 or the OPC structure 306. Such a row is shown as an example in FIG. 2A at 316. The second threshold defines the boundary between the OPC structure 306 and the structure 302 where an intensity exceeding the second threshold is regarded as a combination of the intensities resulting from the background and the structure 302. Such a row is shown as an example at 318. If an overall intensity of a completely sampled row lies between the first threshold and the second threshold, as it is indicated as an example in row 320 in FIG. 2A, this sampled overall row 320 only includes the OPC structure 306. Thus it is possible to detect the edge 314 of the OPC structure 306 when passing the first threshold and to detect the edge 308 of structure 302 when passing the second threshold, and thus the distance of the edges 314 and 308 to each other or an absolute position of these edges, respectively, with regard to a predetermined reference point.

Analogue to that, a corresponding approach is possible when sampling column by column. These approaches are only possible, however, when structures similar to those in FIG. 2A are to be sampled, i.e. when only one dimension is to be determined in one sampling direction. If several dimensions are to be detected in one sampling direction, then the row-wise or column-wise approach, respectively, provides no unique result, so that here again the sampling of individual sample points along one row is to be used.

Figure 1B:
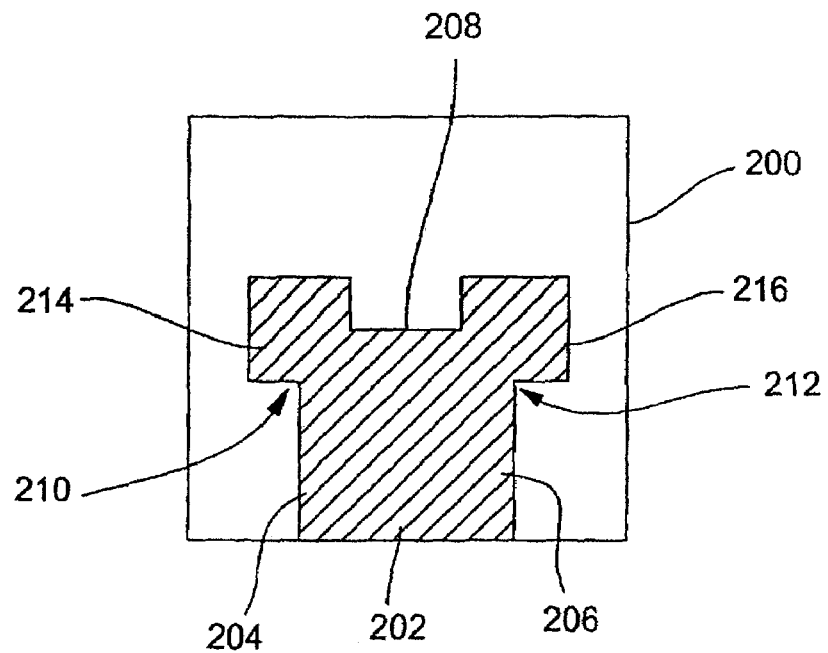
FIG. 1B shows a schematical illustration of a layout for a portion of a photomask, wherein the layout shows a line end with line end serifs.
Figure 2B:
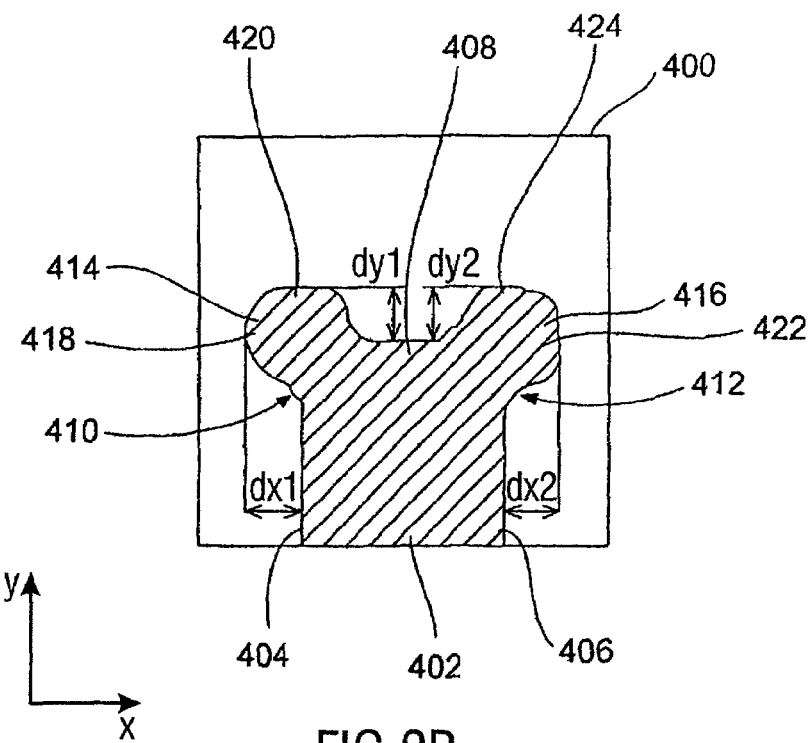
FIG. 2B shows a section of a photomask generated using the layout of FIG. 1B.

In FIG. 2B a section of a photomask is illustrated containing a structure which is obtained after mapping the layout of FIG. 1B onto the photomask. The section 400 shows a portion of a line 402 including two vertical edges 404 and 406 (in y direction) and a horizontal edge 408 (in x direction) connected to the vertical edges in the area of the corners 410 and 412. In the area of the corners 410 and 412 the OPC structures 414 and 416 are formed which were generated in a rounded way compared to the layout in FIG. 1B on the photomask 400 due to the mapping technology.

Similar to the method described as a first alternative with reference to FIG. 2A, here a distance of the vertical edge 404 of the structure 402 to the vertical edge 418 of the OPC structure 414 is determined to be the distance dx1. Further, a distance dy1 of the horizontal edge 408 of the structure 402 to the horizontal edge 420 of the OPC structure 414 is determined. In the line segment 402, subsequently further a distance dx2 between the vertical edge 406 of the structure 402 and the vertical edge 422 of the OPC structure 416 is determined, as well as the distance dy2 between the horizontal edge 408 of the structure 402 and the horizontal edge 424 of the OPC structure 416. The proceedings are similar to the embodiment described with reference to FIG. 2A, it is to be noted, however, that two measurement values each are to be generated for every sampling direction. Thus, first in the x direction for each sampling a location of the edge 404 is determined and in the further sampling the location of the edge 406 and analogue to that the location of the edge 418 or the edge 422, respectively, is determined, wherein from the difference of the thus determined locations a maximum distance dx1 or dx2, respectively, between the edges 404 and 418 and 406 and 422, respectively, is determined. Analogue to that, the locations for the edges 420 and 408 or 422 and 408, respectively, are determined by sampling in the y direction, and from the difference of the locations detected for the edges a maximum distance of the edges dy1 or dy2, respectively, is determined.

The proceedings of detecting an overall intensity for one row or one column, respectively, described above as a second alternative with reference to FIG. 2A, is not possible in the embodiment shown in FIG. 2B, as by this no unique specification of the distances dy1 or dy2, respectively, would be possible.

Analogue to the method in FIG. 2A, for the line end serifs illustrated in FIG. 2B two measurement value pairs dx1, dy1, and dx2, dy2, are obtained, indicating the distance of the edges of the OPC structures to the edges of the structure 402. Optionally, the edge positions with reference to a predetermined reference position, the overall edge course resulting from the individual samplings and the type of the found structure (type, orientation, light/dark) are output.

Alternatively, it is also possible to respectively indicate the absolute positions of the edges with reference to a predetermined reference position.

According to a preferred embodiment of the present invention, after specifying of the area of the photomask 300 or 400 to be examined it is determined what type of structure is arranged within the selected area 300 or 400, respectively, in order to thus perform a case differentiation with regard to the steps to be performed for edge detection. If it is determined, for example, that a structure is contained in the area, as it is shown in FIG. 2A, then here, after reaching an edge in the x direction or the y direction, respectively, the search for a further edge may be terminated. Alternatively, as described above, the overall intensity of a row/column may be used. If it is determined, however, that a structure similar to the one in FIG. 2B is present in the area, then it is required to further detect the other edge after detecting one edge in one of the directions, in order to be able to perform the corresponding measurements.

After the area 300 or 400, respectively, was specified on the photomask, the type of structure contained within the same is identified by comparing a brightness course along all four borders or edges, respectively, of the portion 300 or 400, whereby each structure may uniquely be identified due to the number of intensity transmissions from light to dark determined along each edge. At that, the type of structure (corner or line end), the intensity of the structure (light or dark) and the orientation of the structure with regard to the x or y direction are distinguished. The latter differentiation is facilitated by the fact that on typical photomasks all structures are either oriented horizontally or vertically. If this is not the case, however, the CCD camera itself may be rotated correspondingly and be automatically oriented to the structure.

In the following, the determination of the intensity distribution in the intensity image, the corresponding determination of the threshold value and the identification of a structure according to a preferred embodiment of the present invention are described.

First of all, the ROI is specified again and the brightness distribution is determined. Further, a threshold is specified, as it is described below. Using a histogram, the brightness distribution in the overall ROI is analysed. Maxima of the histogram distribution are searched for. The condition for this is that the maxima are clearly separated, i.e. that they are different by a certain minimum amount in brightness. A suitable function (Gaussian curve) is adjusted to the two highest maxima in order to determine the brightnesses (I1 and I2) corresponding to the maxima more accurately. I1 and I2 correspond to the mean brightnesses for "dark" and "light". The absolute brightness threshold value S is calculated from I1 and I2 using $$S=s/100*(I2-I1)+I1$$

wherein s is the relative threshold value (in %, commonly 50%) to be set by the user. This threshold value S is used both for the identification of the structure type and also for the later edge probing.

Subsequently, the type of structure is determined. In the above-described embodiments only corners (corner serifs) and line ends (line end serifs) are identified. The expansion to other simple structure types is easily possible, however.

The brightnesses in the four corners of the ROI are used in order to enable a first identification of the structure to be measured. For this, the four brightness values are compared to the threshold value S and identified as "light" or "dark" using the same.

With a ratio of light/dark=1/3 and 3/1, the identification is clear; it can only be a corner serif. Simultaneously, by this the orientation and the differentiation "dark corner" or "bright corner" is determined and the identification may be ended.

What is left is the line ends to be identified. With a corner ratio of light/dark=2/2 it can be no line ending; the identification is terminated with an error message. Only with a ratio of 0/4 or 4/0 can the identification be continued. Now, the ROI is searched along all four edges, and using the threshold value S transitions between light and dark are searched for. In case of a line end, only exactly two such transitions along exactly one edge may be present which then specify the type (light or dark) and the orientation of the line end. In any other cases, the identification is terminated with an error message.

After type and orientation of the structure have been specified, now the measuring of the same is started. The measuring is subsequently described with reference to the line end serif OPC structure shown in FIGS. 3A and 3B.

The strategy of edge probing depends on the preceding identification. In the following, the measuring of a "dark upper line end" with line end serifs 500 is described. The generalization to other structure types and orientations is trivial.

Figure 3A:
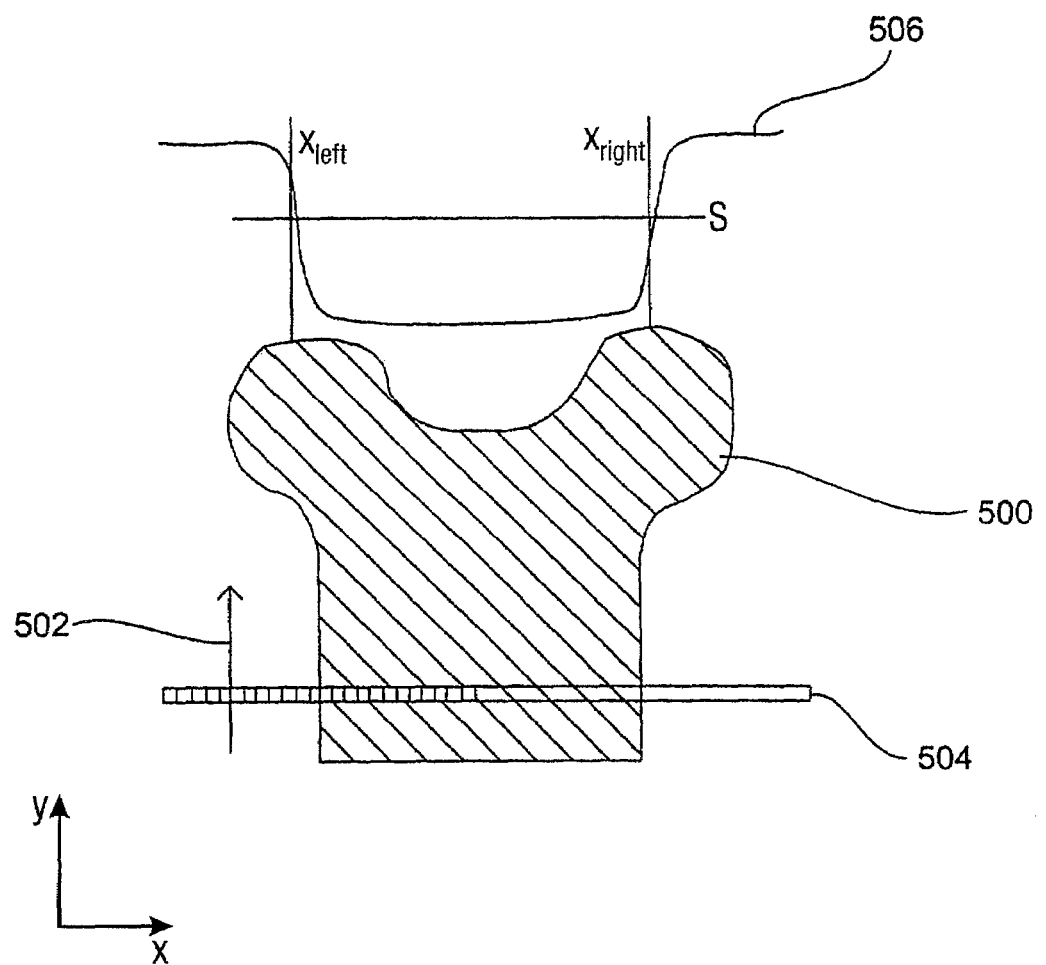
FIG. 3A shows an example for the edge probing in the x direction with line end serifs.

The first sampling is performed row-wise in the x direction, as shown in FIG. 3A, wherein in FIG. 3A one starts at the bottom and proceeds row by row to the top to the line end (see arrow 502). In FIG. 3A a row 504 is shown as an example. If required, also two or several rows each may be combined into one. For each row the brightness profile 506 is extracted and from that, using the threshold value S, the positions of the two transitions light/dark are determined with a greatest possible accuracy. In the area of the line end serifs, four transitions are present; here, only the outer two transitions are measured. The sampling is terminated when no transition is visible any more in the profile, i.e. at the upper end of the line end serifs.

Thus, the two edge courses left and right are obtained as a series of value pairs $x_{left}$ and $x_{right}$. Firstly, the maxima (points of the structure lying farthest out) are determined left and right. Then, the minima (point of the structure lying farthest in) of the edge courses from the bottom boundary of the ROI to the height of the respective maxima are determined.

From these four extreme values of the two edge courses left and right, the OPC dimensions dx1 and dx2 (FIG. 2B) are determined.

Figure 3B:
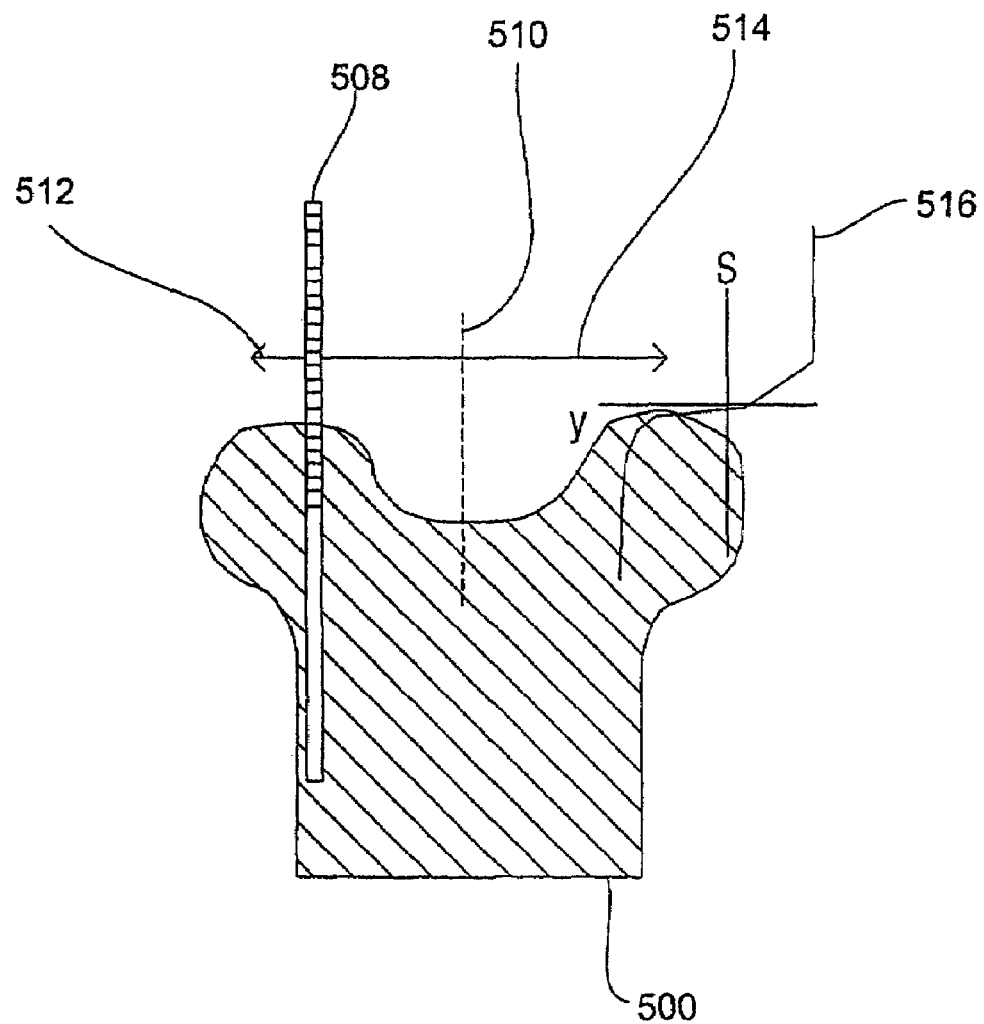
FIG. 3B shows an example for the edge probing in y direction with line end serifs.

The determination of dy1 and dy2 is performed similarly and is illustrated with reference to FIG. 3B. Here, the sampling is performed column-wise, wherein in FIG. 3B as an example a column 508 is shown. Starting from the middle 510 of the structure 500 (determined using the extreme values of the x edge courses in the last step) movements to the left and right are performed (see errors 512, 514). For each column the brightness profile 516 is extracted and from this, using the threshold value S, the position of a transition light/dark is determined with a highest possible accuracy. At that, always only the topmost transition is measured and used if several transitions are found. The column-wise sampling is terminated as soon as no more transition are found left and right.

For each column the position y of the brightness transition is obtained. The y values obtained for all measured columns determine the upper course of the edge.

From the upper course of the edge first of all the maximum values (the topmost points) are determined left and right from the middle 510, and the minimum value (bottommost point) from the part of the edge course between the two maximum values. From these three values the OPC dimensions dy1 and dy2 are obtained.

Instead of the above-described structures, the inventive method may also be used for measuring other structures or elements, e.g. so-called jogs or scatterbars. The inventive method may also be used for the determination of an edge roughness of photomask structures.

The present invention is not limited to the measuring of the structures and OPC structures described in the preferred embodiment, but is generally directed to the identification and measuring of OPC structures using optical microscopy or other mapping methods in an automatic run. Preferably, an identification of the type of structure and the overlaid OPC structure is performed based on an analysis of the brightness distribution in the intensity image or a section of the same, respectively. The actual measuring of the OPC structure is then performed by the above-described spatial high resolution edge sampling using a threshold value method adjusted to the microscope resolution. The inventive proceedings are used on all types of OPC structures and are not limited to those described above.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for an optical measuring of an OPC (Optical Proximity Correction) structure associated with a predetermined structure on a photomask, comprising:
   (a) specifying an area on the photomask including the OPC structure to be measured and a first edge of the predetermined structure;
   (b) sampling of an intensity image of the specified area row-wise in a first direction perpendicular to the first edge of the predetermined structure, and for each row:
      (b.1) determining locations in which an intensity passes a threshold, and
   (c) based on the locations specified in step (b.1), determining a location lying farthest out with reference to the predetermined structure, and a location lying farthest in with reference to the predetermined structure; and
   (d) determining a maximum distance between the first edge of the predetermined structure and a first edge of the associated OPC structure based on the difference of the location lying farthest out and the location lying farthest in.

2. The method according to claim 1, wherein the specified area further includes a second edge of the predetermined structure, and comprising:
   (e) sampling an intensity image of the determined area column-wise in a second direction perpendicular to the second edge of the predetermined structure, and for each column:
      (e.1) determining locations in which the intensity passes the threshold,
   (c) based on the locations specified in step (e.1), determining a location lying farthest out with reference to the predetermined structure and a location lying farthest in with reference to the predetermined structure; and
   (d) determining a maximum distance between the second edge of the predetermined structure and a second edge of the associated OPC structure based on the difference of the location lying farthest out and the location lying farthest in.

3. The method according to claim 1, wherein for detecting the OPC structure in a second direction the photomask is rotated and the steps (b) to (d) are repeated.

4. The method according to claim 1, wherein the threshold is specified based on intensity values associated with the structure and a background.

5. The method according to claim 1, wherein after the step (a) a structure type and/or an orientation of the structure with regard to a reference point is determined for a structure arranged within the specified area.

6. The method according to claim 5, wherein the type of the structure is identified by sampling the area at the corners or completely or partially along the edges of the area, in order to determine the type of the structure depending on the number of intensity transitions between light and dark.

* * * * *